(12) United States Patent
Cornils et al.

(10) Patent No.: US 11,005,033 B2
(45) Date of Patent: May 11, 2021

(54) COMPONENT SEMICONDUCTOR STRUCTURE

(71) Applicant: TDK-MICRONAS GMBH, Freiburg (DE)

(72) Inventors: Martin Cornils, Freiburg (DE); Maria-Cristina Vecchi, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 8 days.

(21) Appl. No.: 16/742,365

(22) Filed: Jan. 14, 2020

(65) Prior Publication Data

US 2020/0227627 A1 Jul. 16, 2020

(30) Foreign Application Priority Data

Jan. 14, 2019 (DE) .................. 102019000166.4

(51) Int. Cl.
*H01L 43/06* (2006.01)
*H01L 43/04* (2006.01)
(Continued)

(52) U.S. Cl.
CPC ........ *H01L 43/065* (2013.01); *G01R 33/0206* (2013.01); *G01R 33/072* (2013.01);
(Continued)

(58) Field of Classification Search
CPC ....... H01L 43/065; H01L 43/04; H01L 43/06; H01L 43/12; H01L 43/14; H01L 24/01;
(Continued)

(56) References Cited

U.S. PATENT DOCUMENTS 9,494,661 B2    11/2016 Paul et al.
10,578,680 B2 *  3/2020 Ausserlechner ... G01R 33/0029
(Continued)

FOREIGN PATENT DOCUMENTS

DE    10 2013 209 514 A1    11/2014

OTHER PUBLICATIONS

Sander et al., "Isotropic 3D Silicon Hall Sensor," IEEE Int'l Conference on MEMS, pp. 838-896 (Jan. 2015).
(Continued)

*Primary Examiner* — David Vu
*Assistant Examiner* — Brandon C Fox
(74) *Attorney, Agent, or Firm* — Muncy, Geissler, Olds & Lowe, P.C.

(57) ABSTRACT

A component semiconductor structure having a semiconductor layer, which has a front side and a back side, at least one integrated circuit being formed on the front side and a first oxide layer being formed on the back side, a monolithically formed semiconductor body having a top surface and a back surface being provided, and a second oxide layer being formed on the back surface, and the two oxide layers being integrally connected to each other, and a sensor region formed between the top surface and the back surface and having a three-dimensional isotropic Hall sensor structure being disposed in the semiconductor body, the Hall sensor structure extending from a buried lower surface up to the top surface, and at least three first highly doped semiconductor contact regions being formed on the top surface and at least three second highly doped semiconductor contact regions being formed on the lower surface.

9 Claims, 2 Drawing Sheets

(51) Int. Cl.
  *H01L 43/14* (2006.01)
  *H01L 23/00* (2006.01)
  *G01R 33/07* (2006.01)
  *G01R 33/02* (2006.01)
  *H01L 23/488* (2006.01)
  *H01L 27/22* (2006.01)
  *H01L 43/12* (2006.01)

(52) U.S. Cl.
  CPC ......... *G01R 33/075* (2013.01); *G01R 33/077* (2013.01); *H01L 23/488* (2013.01); *H01L 24/04* (2013.01); *H01L 27/22* (2013.01); *H01L 43/04* (2013.01); *H01L 43/06* (2013.01); *H01L 43/12* (2013.01); *H01L 43/14* (2013.01); *H01L 2224/02* (2013.01)

(58) Field of Classification Search
  CPC ........... H01L 24/04; H01L 2224/81896; H01L 27/22; G01R 33/072; G01R 33/0206; G01R 33/077; G01R 33/075
  USPC .......................................... 257/421; 324/202
  See application file for complete search history.

(56) References Cited

U.S. PATENT DOCUMENTS

| | | | | |
|---|---|---|---|---|
| 2012/0001279 A1* | 1/2012 | Hioka | ................... | G01R 33/07 257/421 |
| 2014/0070795 A1* | 3/2014 | Kolb | .................. | G01R 33/0052 324/202 |
| 2015/0159989 A1* | 6/2015 | Kim | ..................... | G01R 33/072 324/207.2 |

OTHER PUBLICATIONS

Sander et al., "Monolithic Isotopic 3D Silicon Hall Sensor," Sensors and Actuators A: Physical, vol. 247, pp. 587-597 (2016).

Garrou et al., Handbook of 3D Integration, vol. 1, Chapters 3 and 12, pp. 25-44 and 223-248 (2008).

U.S. Appl. No. 16/742,446, filed Jan. 14, 2020.

* cited by examiner

COMPONENT SEMICONDUCTOR STRUCTURE

This nonprovisional application claims priority under 35 U.S.C. § 119(a) to German Patent Application No. 10 2019 000 166.4, which was filed in Germany on Jan. 14, 2019, and which is herein incorporated by reference.

BACKGROUND OF THE INVENTION

Field of the Invention

The present invention relates to a component semiconductor structure, the component semiconductor structure comprising an integrated circuit and a Hall sensor based on a first semiconductor wafer and a second semiconductor wafer.

Description of the Background Art

A three-dimensional Hall sensor for detecting a spatial magnetic field is known from DE 10 2013 209 514 A1, which corresponds to U.S. Pat. No. 9,494,661, which is incorporated herein by reference, a semiconductor body including at least three electrode pairs, each electrode pair having a first connection on an upper side of the semiconductor body and a second connection on an underside of the semiconductor body, and at least three pairs of electrode pairs forming at least three four-contact structures, which each facilitate the measurement of a spatial component of the magnetic field, using the Hall effect.

An assembly comprising a 3D Hall sensor structure on a circuit board is known from "Isotropic 3D Silicon Hall Sensor," C. Sander et al., 28$^{th}$ IEEE Int. Conference on MEMS, 2015, 838-896, and "Monolithic Isotropic 3D Silicon Hall Sensor," C. Sander et al., Sensors and Actuators A, Col 247, 2016, 587-597.

Various methods for stacking ICs are known from: Handbook of 3D Integration: Technology and Applications of 3D Integrated Circuits,:•P. Garrou et al., Vol. 1, Weinheim: Wiley, 2008, pp. 25-44 and pp. 223-248, Chapters 3 and 12, ISBN 978-527-32034-9, the ICs being connected over a wide area and joined with the aid of through-contact holes.

SUMMARY OF THE INVENTION

It is therefore an object of the present invention to provide a device which refines the prior art.

In an exemplary embodiment of the invention, a component semiconductor structure comprising a semiconductor layer is provided.

The semiconductor layer has a front side and a back side, at least one integrated circuit being formed on the front side and a first oxide layer being formed on the back side.

A monolithically formed semiconductor body having a top surface and a back surface is also provided. A second oxide layer can be formed on the back surface of the semiconductor body.

The two oxide layers, i.e. the top surface of the first oxide layer and top surface of the second oxide layer, are integrally connected to each other by means of a thermal compression joining method, so that a shared insulating layer can be formed between the semiconductor body and the semiconductor layer.

A sensor region having a three-dimensional isotropic Hall sensor structure can be formed between the top surface and the back surface of the semiconductor body, the sensor region preferably having a thickness D.

The sensor region extends from a buried lower surface up to the top surface of the semiconductor body and has a thickness D.

At least three first highly doped semiconductor contact regions, spaced a distance apart, are formed on the top surface, and at least three second highly doped semiconductor contact regions, spaced a distance apart and each having a second conductivity type, are formed on the lower surface.

Each highly doped first semiconductor contact region can be connected with the aid of an assigned first terminal contact, and each highly doped second semiconductor contact region is connected with the aid of an assigned second terminal contact.

The first semiconductor contact regions can be disposed offset from the second semiconductor contact regions in a projection perpendicular to the top surface.

The first semiconductor contact regions and the second semiconductor contact regions each can have a multiple rotational symmetry with respect to an axis of symmetry viewed perpendicularly on the top surface and on the lower surface of the semiconductor body.

It should be noted that the expression "three-dimensional Hall sensor structure" can be understood in the present case to be a Hall sensor which has a cohesive extension within the semiconductor body in all three spatial directions, and all three components of a magnetic field may be determined with the aid of the Hall sensor structure.

It can be understood that the highly doped semiconductor contact regions are preferably formed by means of an implantation step, the dose being above 10e15 N/cm$^2$.

It is also understood that the insulating intermediate layer is completely or predominantly made up of silicon dioxide. During bonding, the oxide layer of the first semiconductor wafer is joined to the oxide layer of the second semiconductor wafer. The two semiconductor wafers are preferably made up of an identical semiconductor material, in particular silicon, to suppress warping in the case of a temperature change, due to different coefficients of expansion.

An advantage of the device is that, with the aid of the component semiconductor structure, a three-dimensional Hall sensor spatially formed in the three spatial directions in the semiconductor layer may be formed together with an integrated circuit on a wafer level plane, in that two already processed semiconductor wafers are connected to each other integrally and in a force-fitting manner by means of a so-called wafer bonding method.

It is advantageous if the integrated circuit is in an electrical operative connection with the Hall sensor structure.

The sensor region of the semiconductor body is laterally delimited with the aid of a circumferential, i.e. for example completely closed, trench structure, the semiconductor body or the sensor region, for example, being provided with a hexagonal shape, i.e. designed as a prism having a hexagonal cross section. In one refinement, the sensor region in the semiconductor body has a different shape, e.g. a square shape or the shape of a polygon, in the projection perpendicular to the top surface.

The trench structure, which can also be referred to as a trench, can be situated at a distance from the first terminal contacts and the second terminal contacts. The depth of the trench structure is preferably designed in such a way that the trench structure completely cuts through the semiconductor layer.

In other words, the depth of the trench structure can correspond to the thickness of the semiconductor layer. The trench structure can have a SiO$_2$ layer running around the entire area on the side walls. A doped polysilicon can be formed between the side walls, the polysilicon being advantageously connected to a reference potential.

The semiconductor body can have a thickness between 2 µm and 50 µm in the sensor region. At most, the semiconductor body preferably has a thickness of up to 100 µm in the sensor region. The thickness of the semiconductor body is preferably constant at least within the sensor region. In particular, the surface on the front side of the semiconductor body and the surface on the underside are almost completely or completely parallel and flat with respect to the each other at least in the area of the sensor region. It should be noted that almost completely can be understood to be a value above 90%.

The ratio between the thickness and length of the semiconductor body in the sensor region is in a range between 0.6 and 1.4 or in a range between 0.8 and 1.2. The ratio is preferably 1.0.

The second terminal contacts can each comprise a highly doped polysilicon of a second conductivity type or a metal.

The second terminal contacts can be electrically connected from the front side, and can be electrically connected from the back side.

One of the first terminal contacts can form a contact pair with one of the second terminal contacts during the measurements, i.e. either a current is injected or a voltage is tapped between the two terminals of the contact pair.

The integrated circuit can be in an electrical operative connection with the Hall sensor structure.

The semiconductor layer can have regions of a first conductivity type, in particular in the area of the integrated circuit. The semiconductor body can be predominantly or completely formed by a second conductivity type.

The first conductivity type can be a p type, and the second conductivity type can be an n type or vice versa.

The semiconductor body and the semiconductor layer can have a uniform lateral extension, in that the joined wafers are preferably sawed through together.

A continuous oxide layer can be formed in the semiconductor layer between the front side and the back side of the semiconductor layer.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
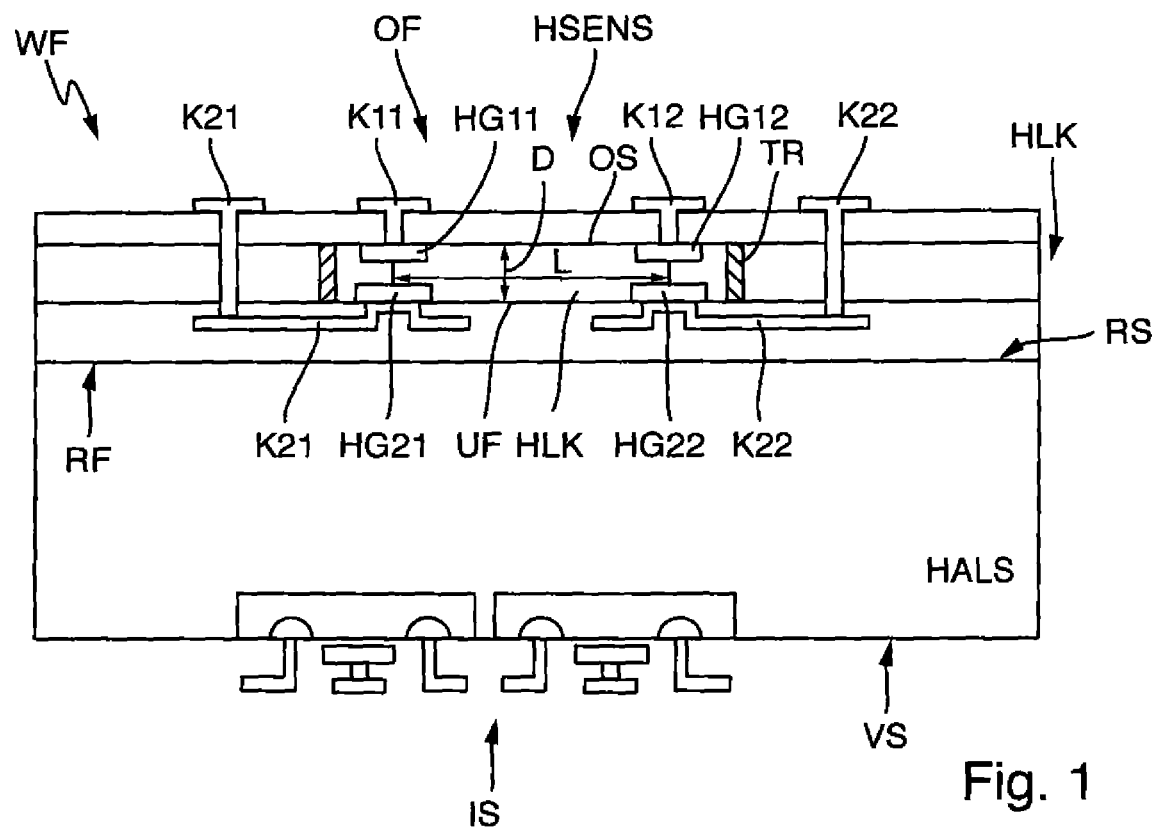
FIG. 1 shows a cross-sectional view of a first specific embodiment.

The illustration in FIG. 1 shows a cross-sectional view of an exemplary embodiment having a sensor region HSENS.

The illustration in FIG. 1 shows a cross-sectional view of a component semiconductor structure WF. Component semiconductor structure WF comprises a semiconductor body HLK manufactured from a first semiconductor wafer and a semiconductor layer HALS manufactured from a second semiconductor wafer. The two semiconductor wafers are joined by means of a wafer bonding process. The semiconductor wafers are preferably made up of silicon.

Semiconductor layer HALS has a front side VS and a back side RS, at least one integrated circuit IS being formed on front side VS and a first oxide layer being formed on back side RS.

Monolithically formed semiconductor body HLK has a top surface OF and a back surface RF. A second oxide layer is formed on back surface RS.

The two oxide layers are integrally connected to each other by means of a thermal compression joining method, a shared insulating layer being formed between semiconductor body HLK and semiconductor layer HALS.

Semiconductor body HLK has a sensor region formed between top surface OF and back surface RF including a three-dimensional isotropic Hall sensor structure HSENS, Hall sensor structure HSENS extending from a buried lower surface UF up to an upper side OS below top surface OF. The sensor region of semiconductor body HLK is delimited by a circumferential trench structure TR.

The second oxide layer is formed below lower surface UF. Another insulating layer is also formed on upper side OS up to top surface OF. In other words, Hall sensor structure HSENS extends over the entire thickness of the semiconductor material.

Semiconductor body HLK has a thickness between 2 µm and 50 µm in the sensor region.

The ratio between the thickness and length of semiconductor body HLK in the sensor region is in a range between 0.6 and 1.4 or in a range between 0.8 and 1.2.

At least three first highly doped semiconductor contact regions HG11, HG12, HG13, spaced a distance apart, are formed on top surface OF, and at least three second highly doped semiconductor contact regions HG21, HG22, HG23, spaced a distance apart and each having a second conductivity type, are formed on lower surface UF. Only two of the three first highly doped semiconductor contact regions HG11, HG12 and only two of the three second highly doped semiconductor contact regions HG21, HG22 on lower surface UF are illustrated in the cross-sectional view.

Each highly doped first semiconductor contact region HG11, HG12, HG13 is connected with the aid of an assigned first terminal contact K11, K12, K13, and each highly doped second semiconductor contact region HG21, HG22, HG23 is connected with the aid of an assigned second terminal contact K21, K22, K23.

Each of second terminal contacts K21, K22, K23 preferably comprises a highly doped polysilicon of a second conductivity type or a metal.

First semiconductor contact regions HG11, HG12, HG13 are disposed offset from second semiconductor contact regions HG21, HG22, HG23 in a projection perpendicular to top surface OF.

First semiconductor contact regions HG11, HG12, HG13 and second semiconductor contact regions HG21, HG22, HG23 each have a multiple rotational symmetry with respect to an axis of symmetry viewed perpendicularly on top surface OF and on lower surface UF of semiconductor body HLK.

Semiconductor body HLK and semiconductor layer HALS have an identical lateral extension.

Integrated circuit IS is in an electrical operative connection with Hall sensor structure HSENS, the design of the operative connection not being illustrated.

Figure 2:
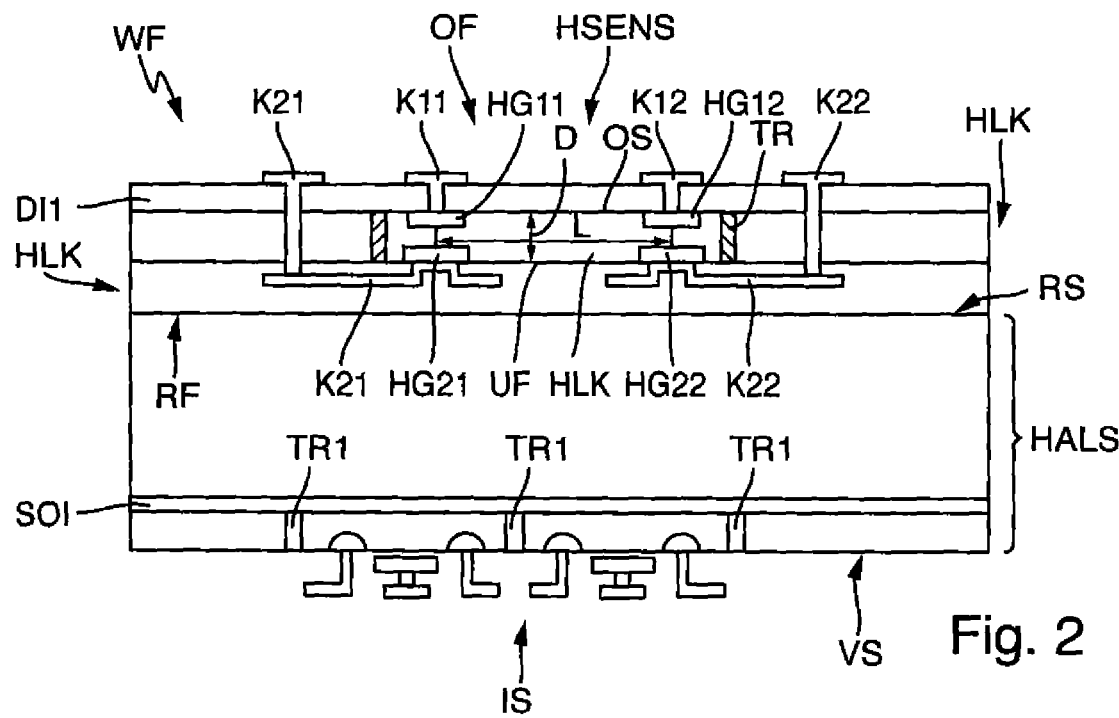
FIG. 2 shows a cross-sectional view of a second specific embodiment.

The illustration in FIG. 2 shows a cross-sectional view of a second specific embodiment having a sensor region HSENS. Only the differences from the illustration in FIG. 1 are explained below.

Semiconductor layer HALS comprises an oxide layer SOI formed continuously between front side VS1 and back side RS1.

The integrated circuit includes a plurality of vertical insulation trenches TR1. Insulation trenches TR1 extend from front side VS up to continuous oxide layer SOI.

Figure 3:
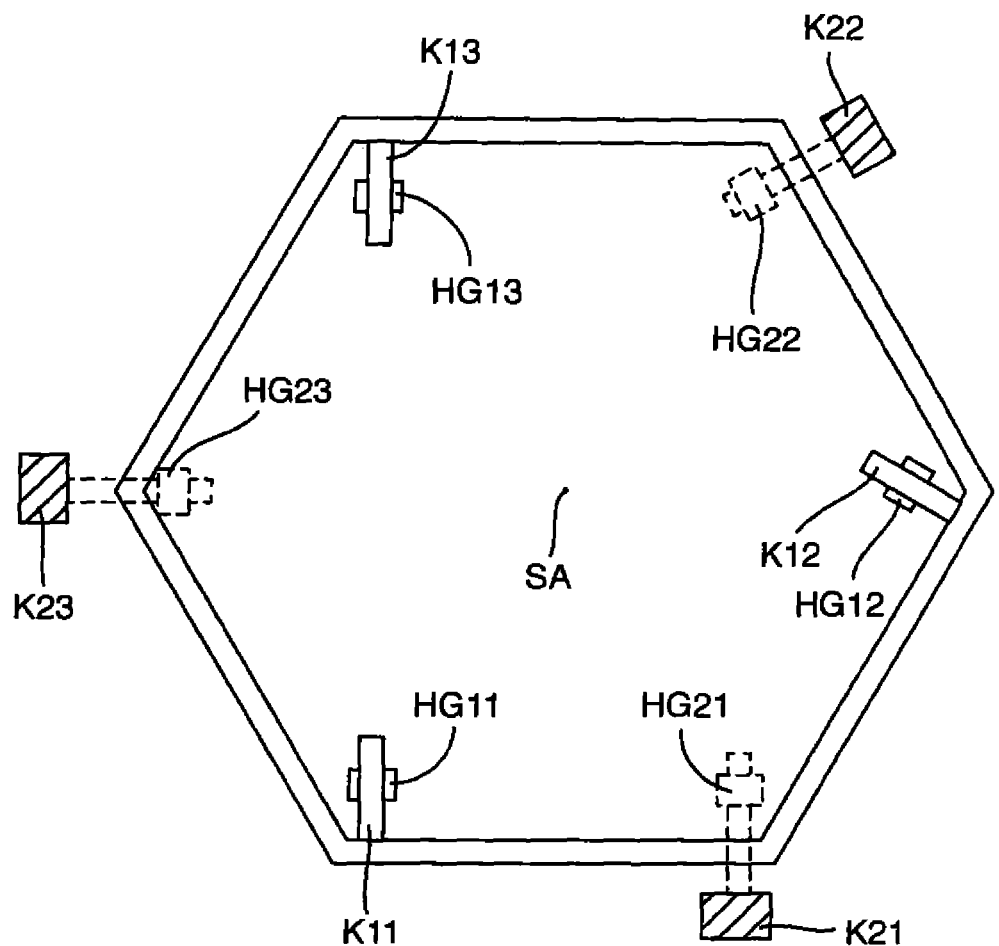
FIG. 3 shows a top view of an upper side of the sensor region illustrated in FIG. 1 or FIG. 2.

The illustration in FIG. 3 shows a top view of a top surface OF of the sensor region illustrated in FIG. 1 or FIG. 2. Only the differences from the preceding illustrations are explained below.

Semiconductor body HLK and thus also sensor region HSENS are separated from the other regions of the semiconductor layer of semiconductor body HLK with the aid of circumferential trench structure TR. In the present case, sensor region HSENS has a hexagonal cross section. First semiconductor contact regions HG11, HG12 and HG13 and second semiconductor contact regions HG21, HG22 and HG23 are disposed near trench structure TR and preferably in the corners of the hexagonal structure.

It should be noted that the cross section of sensor region HSENS is also provided with a square design or is designed in the shape of a polygon in other specific embodiments.

Second semiconductor contact regions HG21, HG22 and HG23—drawn with a dashed line—have a multiple, in particular a ternary, symmetry with regard to an axis of symmetry SA.

First semiconductor contact regions HG11, HG12 and HG13 are formed on upper side OS and also have a multiple, in particular a ternary, symmetry with regard to axis of symmetry SA.

First semiconductor contact regions HG11, HG12 and HG13 on upper side OS are disposed, offset from second semiconductor contact regions HG21, HG22 and HG23, on buried lower surface US.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A component semiconductor structure comprising:
   a semiconductor layer having a front side and a back side;
   at least one integrated circuit formed on the front side;
   a first oxide layer being formed on back side;
   a monolithically formed semiconductor body having a top surface and a back surface;
   a second oxide layer formed on the back surface, the first and second oxide layers being integrally connected to each other via a thermal compression joining method;
   a shared insulating layer being formed between the semiconductor body and the semiconductor layer;
   a sensor region formed between the top surface and the back surface and having a three-dimensional isotropic Hall sensor structure being disposed in the semiconductor body, the Hall sensor structure extending from a buried lower surface up to an upper side;
   a circumferential trench structure delimiting the sensor region of the semiconductor body;
   at least three first highly doped semiconductor contact regions spaced a distance apart, and formed on the top surface; and
   at least three second highly doped semiconductor contact regions spaced a distance apart and having a second conductivity type and formed on lower surface,
   wherein the highly doped first semiconductor contact region is connected with the aid of an assigned first terminal contact and the highly doped second semiconductor contact region is connected with the aid of an assigned second terminal contact,
   wherein the first semiconductor contact regions are disposed offset from the second semiconductor contact regions in a projection perpendicular to the top surface, and
   wherein the first semiconductor contact regions and the second semiconductor contact regions each have a multiple rotational symmetry with respect to an axis of symmetry viewed perpendicularly on the top surface and on the lower surface of the semiconductor body.

2. The component semiconductor structure according to claim 1, wherein the semiconductor body has a thickness between 2 µm and 50 µm in the sensor region.

3. The component semiconductor structure according to claim 1, wherein a ratio between the thickness and length of the semiconductor body in the sensor region is in a range between 0.6 and 1.4 or in a range between 0.8 and 1.2.

4. The component semiconductor structure according to claim 1, wherein the second terminal contacts comprise a highly doped polysilicon of a second conductivity type or a metal.

5. The component semiconductor structure according to claim 1, wherein the integrated circuit is in an electrical operative connection with the Hall sensor structure.

6. The component semiconductor structure according to claim 1, wherein the semiconductor layer has regions of a first conductivity type, and the semiconductor body has regions predominantly of a second conductivity type.

7. The component semiconductor structure according to claim 6, wherein the first conductivity type is p and the second conductivity type is n or vice versa.

8. The component semiconductor structure according to claim 1, wherein the semiconductor body and the semiconductor layer have a substantially identical lateral extension.

9. The component semiconductor structure according to claim 1, wherein a continuous oxide layer is formed in the semiconductor layer between the front side and the back side.

* * * * *